(12) United States Patent
He et al.

(10) Patent No.: US 9,218,826 B1
(45) Date of Patent: Dec. 22, 2015

(54) TUNED HORIZONTALLY SYMMETRIC MAGNETIC STACK

(71) Applicant: Seagate Technology LLC, Cupertino, CA (US)

(72) Inventors: Qing He, Plymouth, MN (US); Mark Covington, Edina, MN (US); Wonjoon Jung, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 3 days.

(21) Appl. No.: 13/968,539

(22) Filed: Aug. 16, 2013

(51) Int. Cl.
*G11B 5/39* (2006.01)
*G11B 5/147* (2006.01)

(52) U.S. Cl.
CPC ............ *G11B 5/147* (2013.01); *G11B 5/1475* (2013.01); *G11B 5/3906* (2013.01); *G11B 5/3909* (2013.01)

(58) Field of Classification Search
CPC ...... G11B 5/39; G11B 5/3903; G11B 5/3906; G11B 5/3909; G11B 5/3929; G11B 5/3932; G11B 2005/3996
USPC ................. 360/324.1, 324.11, 324.12, 324.2
See application file for complete search history.

(56) References Cited

U.S. PATENT DOCUMENTS

| | | | |
|---|---|---|---|
| 6,587,317 B2 | 7/2003 | Gill | |
| 6,680,831 B2 | 1/2004 | Hiramoto et al. | |
| 6,953,601 B2 | 10/2005 | Li et al. | |
| 7,035,062 B1* | 4/2006 | Mao et al. | 360/324.2 |
| 7,446,982 B2 | 11/2008 | Gill | |
| 7,635,654 B2 | 12/2009 | Sun et al. | |
| 8,015,694 B2* | 9/2011 | Carey et al. | 29/603.16 |
| 8,259,420 B2 | 9/2012 | Zhao et al. | |
| 8,294,228 B2* | 10/2012 | Peng et al. | 257/421 |
| 8,337,676 B2 | 12/2012 | Zhao et al. | |
| 8,339,736 B2 | 12/2012 | Gao et al. | |
| 8,373,948 B2 | 2/2013 | Zeltser | |
| 8,427,791 B2 | 4/2013 | Gao et al. | |
| 8,553,369 B2* | 10/2013 | Song et al. | 360/324.12 |
| 8,670,217 B1* | 3/2014 | Braganca et al. | 360/324.12 |
| 8,717,715 B1* | 5/2014 | Sato et al. | 360/324 |
| 8,749,926 B1* | 6/2014 | Le et al. | 360/324.12 |
| 8,879,214 B2* | 11/2014 | Nishioka | 360/324.12 |
| 2002/0135954 A1* | 9/2002 | Yoshikawa et al. | 360/324.12 |
| 2005/0219770 A1* | 10/2005 | Gill | 360/324.2 |
| 2009/0207533 A1* | 8/2009 | Shimazawa | 360/324.1 |
| 2009/0257154 A1* | 10/2009 | Carey et al. | 360/324.12 |
| 2010/0061023 A1* | 3/2010 | Ohta et al. | 360/324.12 |
| 2012/0146167 A1* | 6/2012 | Huai et al. | 257/421 |
| 2012/0193738 A1 | 8/2012 | Wang et al. | |
| 2012/0257298 A1 | 10/2012 | Sato et al. | |
| 2013/0005032 A1 | 1/2013 | Min et al. | |
| 2013/0164549 A1* | 6/2013 | Nishioka | 428/469 |
| 2014/0021566 A1* | 1/2014 | Park et al. | 257/421 |
| 2014/0084398 A1* | 3/2014 | Oguz et al. | 257/421 |
| 2014/0153324 A1* | 6/2014 | Yu | 365/158 |
| 2014/0154528 A1* | 6/2014 | Sankar et al. | 428/811.1 |
| 2014/0327095 A1* | 11/2014 | Kim et al. | 257/421 |

* cited by examiner

*Primary Examiner* — Jefferson Evans
(74) *Attorney, Agent, or Firm* — Hall Estill Attorneys at Law

(57) ABSTRACT

A data storage device may be constructed as a data reader in various embodiments with a magnetic stack that has a barrier layer disposed between first and second magnetically free layers. The magnetic stack may have a horizontally symmetrical configuration that provides negative exchange coupling between the magnetically free layers.

20 Claims, 5 Drawing Sheets

TUNED HORIZONTALLY SYMMETRIC MAGNETIC STACK

SUMMARY

Various embodiments can generally be directed to a data storage device capable of distinguishing data bits.

In accordance with various non-limiting embodiments, a magnetic stack may have a barrier layer disposed between first and second magnetically free layers. The magnetic stack may further be configured as horizontally symmetrical to provide negative exchange coupling between the magnetically free layers.

DETAILED DESCRIPTION

Advancement of data storage devices, especially rotating data environments, towards higher data capacities with reduced form factors has emphasized minimizing magnetic element size while maintaining high speed, reliable magnetic operation. Many data sensing laminations are not scalable to small enough dimensions to advance data storage device capabilities for modern, mobile electronics devices. While a trilayer data sensing magnetic stack may provide reduced dimensions due to a lack of any fixed magnetization layers in the trilayer magnetic stack, inadvertent magnetic interactions within the trilayer stack can degrade data sensing performance. Hence, industry is interested in a magnetic stack that exhibits heightened magnetic stabilization and optimized performance in a scalable package.

Accordingly, a data storage device may have a magnetic stack with at least a barrier layer disposed between first and second magnetically free layers in a horizontally symmetrical configuration that provides negative exchange coupling between the magnetically free layers. The production of negative exchange coupling can allow for a high tunnel magnetoresistance (TMR) in a magnetic stack constructed with a reduced resistance area (RA). The ability to tune the magnetostatic interactions across the barrier layer can adapt a magnetic stack to a variety of diverse data storage environments while providing high signal-to-noise (SNR) and near-zero magnetic asymmetry, which corresponds to high TMR performance.

Figure 1:
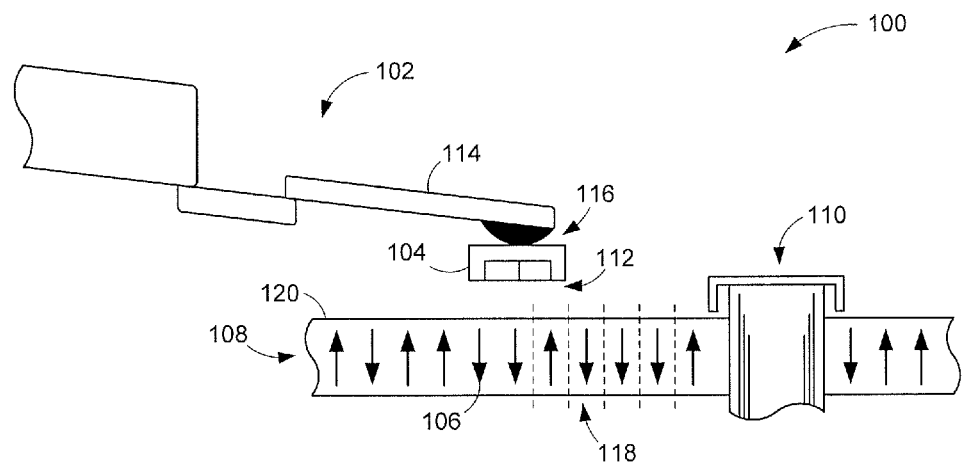
FIG. 1 generally provides of a block representation of an example data storage environment.

An example portion of a data storage device 100 is illustrated in block from in FIG. 1. The data storage device 100 and constituent components are not required or limiting, but do conform to an environment where a tuned magnetic stack can be practiced in accordance with various embodiments. As shown, the data storage device 100 has an actuating assembly 102 that positions a transducing head 104 over programmed data bits 106 present on a magnetic storage media 108 that is attached to, and rotates about, a spindle motor 110 to produce an air bearing surface (ABS) 112. The speed in which the spindle motor 110 rotates allows a slider portion 114 of the actuating assembly 102 to fly on the ABS 112 to position a head gimbal assembly (HGA) 116, which includes the transducing head 104, over a desired portion of the media 108.

The transducing head 104 may be constructed with one or more transducing elements, such as a magnetic writer and magnetically responsive reader, which operate to program data to and read data bits 106 from the storage media 108, respectively. In this way, controlled motion of the actuating assembly 102 and spindle motor 110 can modulate the position of the transducing head 104 both laterally along predetermined data tracks 118 defined on the storage media surface 120 and vertically as measured perpendicularly to the media surface 120 across the ABS 112 to selectively write, read, and rewrite data.

Figure 2:
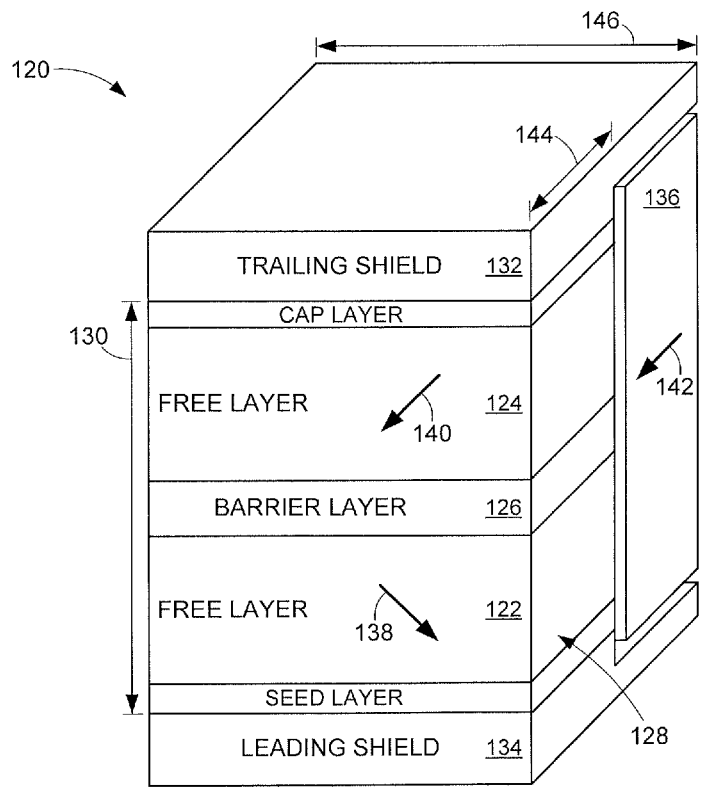
FIG. 2 is an isometric view of an example portion of a data storage device capable of being used in the data storage environment of FIG. 1.

While a variety of data transducing means may be utilized in the data storage device 100 of FIG. 1, FIG. 2 displays an isometric block representation of a portion of a data reader 120 configured and operated in accordance with some embodiments. The data reader 120 may be characterized as a trilayer sensor as first 122 and second 124 magnetically free layers contact opposite sides of a non-magnetic barrier layer 126 on an air bearing surface (ABS) as part of a magnetic stack 128. Configuring the data reader 120 with dual magnetically free layers and no fixed magnetization reference structure, such as an antiferromagnetic layer or permanent magnet, allows the shield-to-shield spacing 130 between the trailing 132 and leading 134 shields to be decreased. Such a lack of a fixed magnetization in the magnetic stack 128 can, however, correspond to unpredictable free layer 122 and 124 interactions that can drive the free layer magnetizations to a common direction, such as along the Z axis, that leads to positive magnetic asymmetry and limits magnetic response to encountered data bits, especially when the magnetic stack 128 is scaled to nanometer scale dimensions.

Placement of a bias magnet 136 adjacent to and separated from each free layer 122 and 124 can induce an orthogonal default magnetization orientations 138 and 140 in the respective free layers 122 and 124 that provides consistent and reliable magnetic response to encountered data bits. The bias magnet 136 may be configured with a greater thickness along the Y axis than the magnetic stack 128 by continuously extending into notches of the trailing 132 and leading 134, distal to the ABS, to allow a sufficiently strong bias magnetization 142 to set the free layer default magnetizations while allowing the free layers to respond to external data bits.

The default magnetizations 138 and 140 of the free layers 122 and 124 can be set to predetermined strength by magnetostatic coupling and interlayer coupling between the first 122 and second 124 free layers. The magnetostatic coupling relates to the shape anisotropy of the magnetic materials and depends on the aspect ratio of top and bottom free layers respectfully, as well as their materials properties like saturation magnetization and stress, as well as spacer thickness.

Interlayer coupling strength may have Neel (interfacial) coupling and RKKY (interlayer) coupling where negative values correspond to antiferromagnetic "antiparallel" coupling and positive values correspond to ferromagnetic "parallel" coupling.

The predetermined orientation and strength of the default magnetizations 138 and 140 can allow the free layers to respectively rotate, or scissor, in response to encountered data bits to produce a data signal. With increased stripe heights 144 from the ABS and reduced distances between the free layers 122 and 124, the free layer magnetizations 138 and 140 can couple together along the entirety of the stripe height 144, which can degrade magnetic performance as magnetic noise is produced that dampen the default magnetization's 138 and 140 reaction to magnetic fields corresponding to data bits. Such dampened magnetizations can combine with the minimization of transducing element dimensions, like free layers 122 and 124, to reduce the data signal amplitude compared to physically large shield-to-shield spacing 130 transducing elements, which may result in unreliable data reading, higher error rates, and increased data storage latency.

It should be noted that the term "stack" is an unlimited term within this disclosure that can be one or more vertically and horizontally aligned layers, constructed of magnetic and non-magnetic material that are capable of magnetic reading and writing. Throughout the present application, the term "stack" will be understood to mean a component that is constructed to respond to external data bits to provide access to external data bits in any operational environment. For example, but not in any way limiting, a magnetic stack may be a data read or write configuration that can differentiate between a plurality of data bits.

With the scalability of data readers being emphasized to increase data storage capacity while maintaining fast and reliable data sensing, the resistance area of the magnetic stack 128 plays a role in how small a data reader can be constructed while still exhibiting accurate data sensing. The resistance area of the magnetic stack 128 may be defined by the stripe height 144 and width 146 of the respective free layers 122 and 124 on the ABS, as illustrated in FIG. 2, and can determine the magnetostatic interactions across the barrier layer 126 and the influence of bias magnetization 142 of the bias magnet 136 on the free layer default magnetizations 138 and 140.

As such, a reduction in the physical dimensions and resistance area of the magnetic stack 128 can increase the ferromagnetic exchange coupling across the barrier layer 126. The increase in ferromagnetic coupling can induce the default free layer magnetizations 138 and 140 to rotate randomly or uniformly in directions that decrease the magnetic margin that is sensed as different resistances that correspond to one of a plurality of data bit logical states. Hence, minimizing the ferromagnetic coupling across the barrier layer 126 can allow the resistance area of the magnetic stack 128 to scale down while maintaining accurate magnetic response to encountered data bits.

Figure 3:
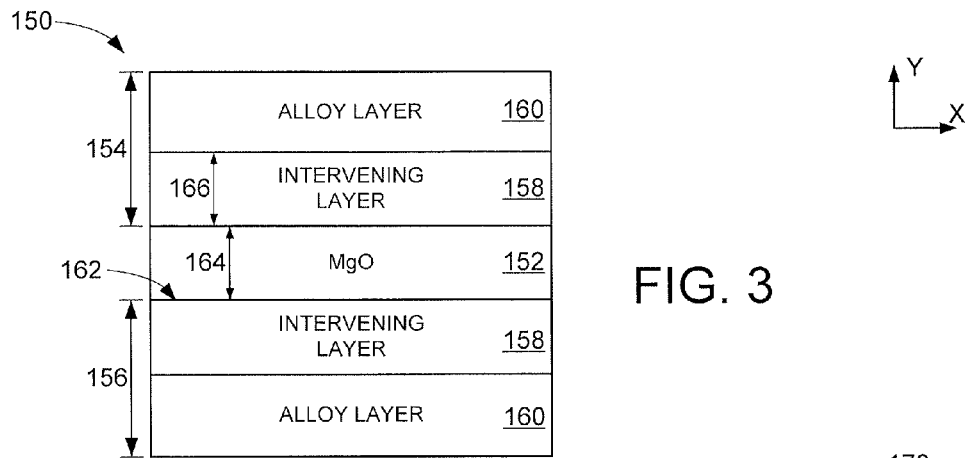
FIG. 3 shows a block representation ABS view of a portion of an example data reader constructed in accordance with various embodiments.

FIG. 3 displays an ABS view block representation of an example magnetic stack 150 that may be implemented into an unlimited variety of data storage devices in accordance with various embodiments. The magnetic stack 150 has a barrier layer 152 constructed of MgO with a thickness along the Y axis of 0-3 nm, but such configuration is not limiting as a number of different non-magnetic materials can be used to provide a magnetoresistance between the first 154 and second 156 magnetically free bi-layers. Each free bi-layer may be formed, as shown, with an intervening layer 158 separating a metal layer 160 from the MgO barrier layer 152. The intervening layer 158, in some embodiments, is a pure metal material, which can promote higher ferromagnetic coupling across the barrier layer 152. Assorted embodiments may also configure the intervening layer 158 and/or adjacent alloy layer 160 of multiple materials that can comprise 0-20 atomic percent of: V, Hf, W, Ta, W, Zr, Ni, Cr, Mg, Nb, Mo, and Be.

One or both intervening layers 158 can also be processed to have a predetermined surface roughness at the interface 162 between the free bi-layer 154 and 156 and the barrier layer 152 to reduce the presence of orange peel coupling associated with roughness at a layer interface. The predetermined surface roughness at the interface 162 may be constructed in an unlimited variety of manners, but is plasma etched in various embodiments with a tuned power and duration to ensure continuously uniform roughness throughout between two layers and the removal of 0-1 nm of material. For example, a 200 mm wafer that contains multiple magnetic stack laminations can have a tuned plasma etching power of between 10 and 300 Watts for approximately 0 to 360 seconds to produce a free bi-layer thickness of 0-10Å. Such interface 162 conditioning with plasma etching tuned for time and power can lower the ferromagnetic coupling across the barrier layer 152 while maintaining TMR performance for the magnetic stack 150, which corresponds to good scalability of the stack 150.

Regardless of the use of a smoothed interface 162 or tuned plasma etching conditions, ferromagnetic coupling between the free bit-layers 154 and 156 may be mitigated by tuning the respective thicknesses 164 and 166 of the barrier 152 and intervening 158 layers, as measured along the Y axis at the ABS. That is, the barrier layer thickness 164 and intervening layer thickness 166 may be independently configured with predetermined thicknesses along the X axis at the ABS to tune the ferromagnetic coupling between the first 154 and second 156 free bi-layers. A non-limiting embodiment further tunes the ferromagnetic coupling within the magnetic stack 150 by constructing the intervening layers 158 with different thicknesses on opposite sides of the barrier layer 152 while other embodiments have the intervening layers 158 each with a common thickness.

Figure 4:
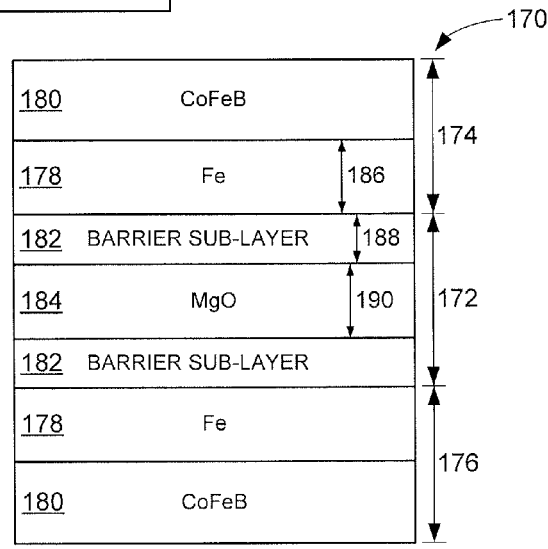
FIG. 4 illustrates a block representation ABS view of a portion of an example data reader configured in accordance with some embodiments.

The intervening 158 and barrier 152 layers may also be tuned through material selection to control the ferromagnetic coupling within the magnetic stack 150. FIG. 4 shows an ABS view block representation of an example magnetic stack 170 configured in accordance with some embodiments with a barrier lamination 172 disposed between first 174 and second 176 magnetically free bi-layers each having an iron intervening layer 178 and a CoFeB alloy layer 180. Construction of the intervening layers 178 can exhibit minimized ferromagnetic coupling. Accordingly, an intervening layer 178 can allow the CoFeB alloy layers 180 of the free bi-layers 174 and 176 to interact with more controlled behavior with minimal TMR performance loss. The separation of the alloy layers 180 by the intervening layers 178 can be complemented by the insertion of barrier sub-layers 182, which can be constructed as magnesium in some non-limiting embodiments with a 0-1 nm thickness along the Y axis to serve to buffer the MgO barrier core 184.

Figure 5:
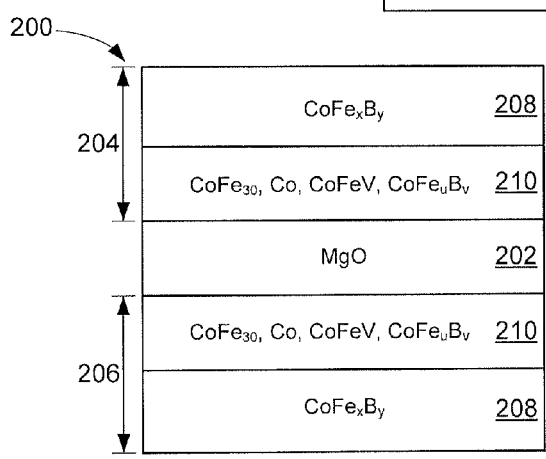
FIG. 5 displays a block representation ABS view of a portion of an example data reader configured in accordance with various embodiments.

The inclusion of the barrier sub-layers 182 provides additional barrier layer thicknesses 188 and 190. It should be noted that disposing the MgO barrier core 184 between barrier sub-layers 182 is not required to mitigate and tune coupling within the magnetic stack 170. FIG. 5 provides an ABS view block representation of an example magnetic stack 200 that utilizes a single MgO barrier layer 202 having a 0-3 nm thickness as measured along the Y axis and simultaneously contacting first 204 and second 206 magnetically free bi-layers that are tuned for material in accordance with various embodiments. The ferromagnetic coupling tendency of boron may be reduced by configuring the alloy layer 208 of each free bi-layer 202 and 204 as $CoFe_xB_y$ where x and y are different atomic percentages such as x being between 0-100 atomic % while y is between 0-40 atomic %. For example x can be 35, 36, and 48 while y is 10, 13, 18.7, and 20, respectively.

The minimization of boron content in the alloy layers 208 can correspond with a variety of different tuned, boron-free intervening layer 210 materials like the $CoFe_{30}$, Co, CoFeV, and $CoFe_uB_v$ where u is between 0-100 atomic % while v is between 0-20 atomic % and the layer 210 has a 0-4 nm thickness along the Y axis. The tuned materials of the alloy 208 and intervening 210 layers can preserve TMR performance in the magnetic stack 202 despite reduction in stack resistance area and intra-stack ferromagnetic coupling. The variety of materials available for the intervening layers 210 may allow for different bi-layer 204 and 206 configurations on opposite sides of the MgO barrier layer 202. However, such dissimilar bi-layer 204 and 206 material construction is not required as some embodiments configure each free bi-layer 204 and 206 with the same materials and thicknesses.

Figure 6:
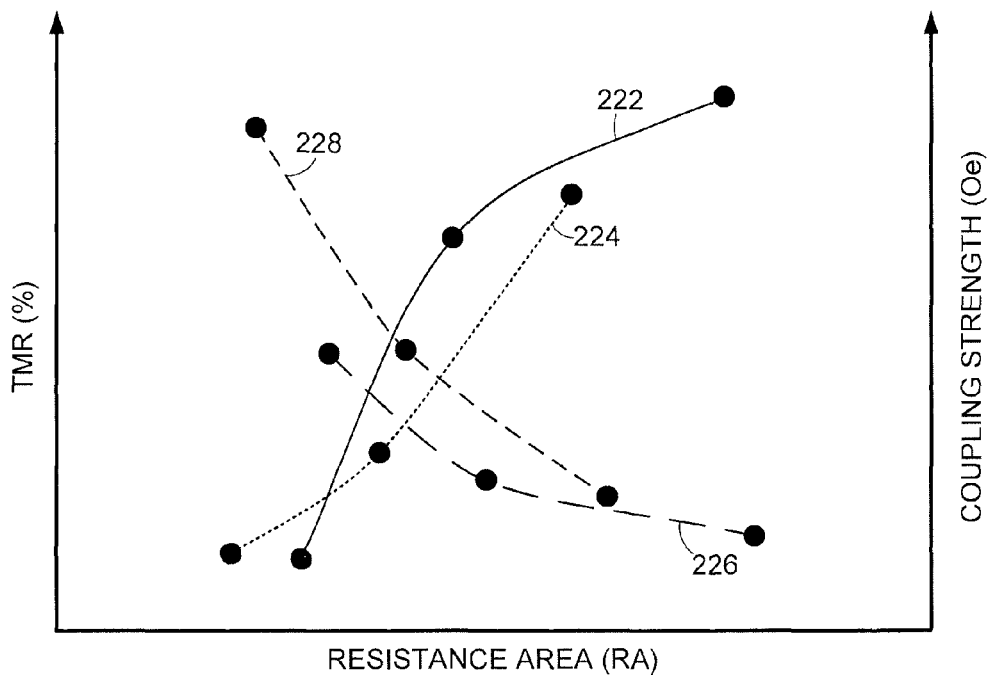
FIG. 6 plots example operational data from a magnetic stack configured and operated in accordance with some embodiments.

The operational capability of an example tuned magnetic stack configuration, which may be similar or dissimilar to stacks 150, 170, and 200 of FIGS. 3-5, is generally graphed in FIG. 6. Solid 222 and segmented 224 lines respectively correspond to TMR performance over a variety of resistance areas that have been constructed either with plasma etching (line 222) or without (line 224). The respective lines 222 and 224 illustrate how TMR is relatively unaffected by tuned plasma etching of at least one interface between layers within a magnetic stack. Lines 226 and 228 respectively correspond to coupling strength over a range of resistance areas for a magnetic stack with a tuned plasma etched interface (line 226) and without (line 228). The difference between lines 226 and 228 indicates that intra-stack coupling can be reduced by smoothing at least one interface of a magnetic stack. The combined data from FIG. 6 shows how magnetic performance can be maintained or improved with reduced resistance area magnetic stack dimensions.

Figure 7:
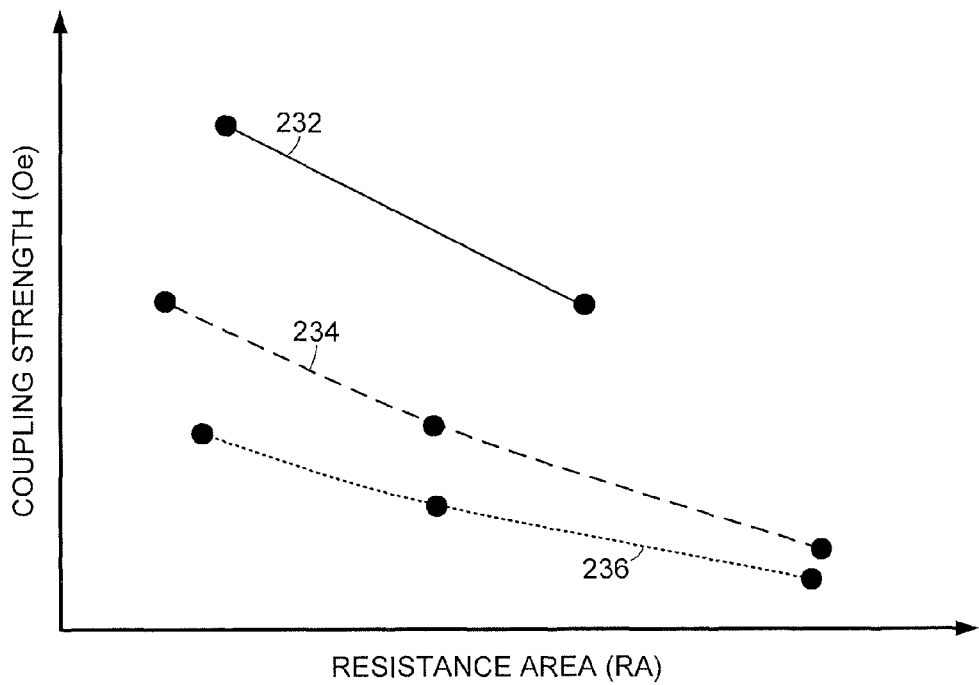
FIG. 7 presents example operational data from a magnetic stack configured and operated in accordance with various embodiments.

FIG. 7 plots example operational data from a variety of different, non-limiting magnetic stacks each configured and operated in accordance with some embodiments. Solid line 232 represents a magnetic stack with a single $CoFe_{48}B_{20}$ free layer contacting opposite sides of a barrier layer. In comparison, segmented lines 234 and 236 respectively correspond to a boron-free intervening layer that separates a boron-containing metal alloy layer from a barrier layer. Line 234 represents a $CoFe_{30}$ intervening layer of a free bi-layer configuration that exhibits reduced coupling strength for a variety of resistance areas compared to line 232.

Further coupling strength reduction from line 232 can be tuned into a magnetic stack by constructing the intervening layer as CoFeV, as shown by line 236. It can be appreciated from FIG. 7 that the insertion of a boron-free intervening layer on opposite sides of a barrier layer can mitigate coupling between free bi-layers. As a non-limiting example, a 4 Å thick intervening layer of $(CoFe_{30})V_7$ can minimize coupling between boron-containing metal alloy free layers while providing little to no reduction in TMR performance. The tuning possibilities with a magnetic stack can dictate data storage performance and scalability.

Figure 8:
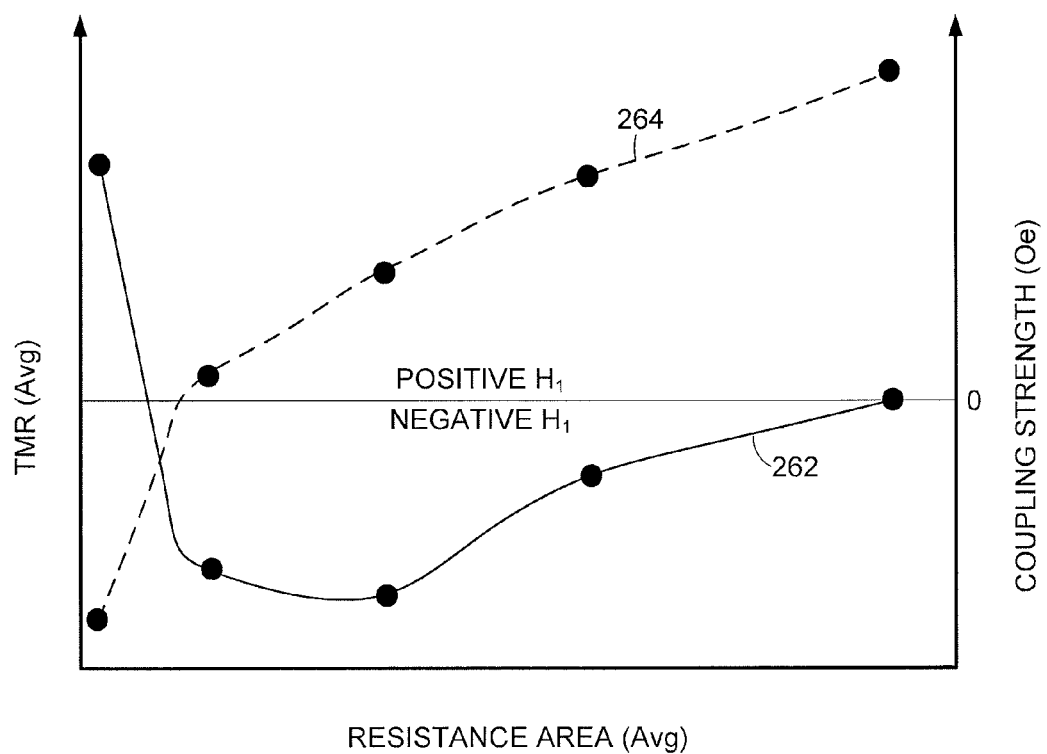
FIG. 8 graphs example operational data from a magnetic stack configured and operated in accordance with some embodiments.
Figure 9:
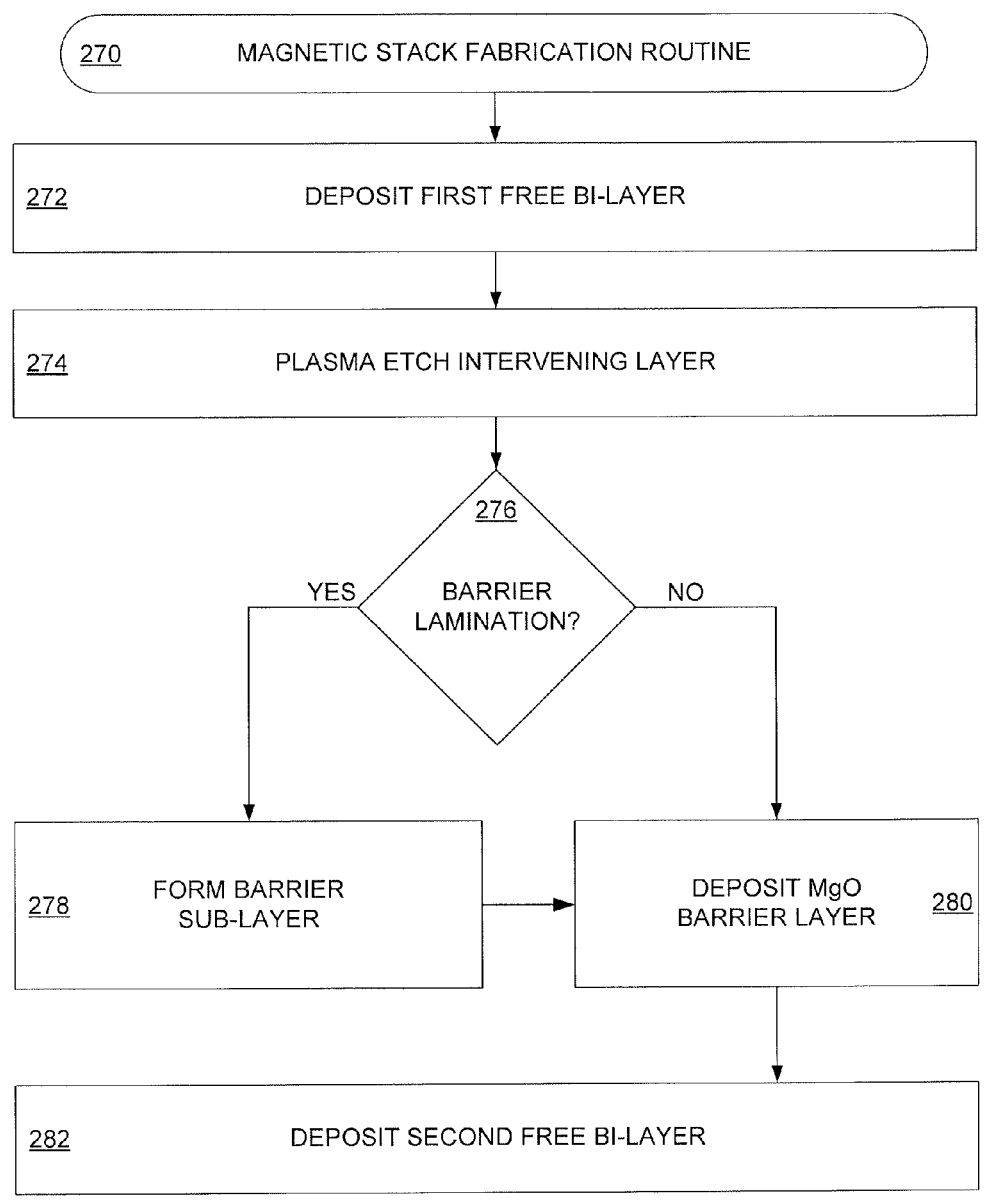
FIG. 9 provides an example magnetic stack fabrication routine carried out in accordance with various embodiments.

FIG. 8 graphs average TMR and coupling strength for example magnetic stacks configured with different resistance areas. Solid line 262 provides the coupling strength while segmented line 264 represents the average TMR for various average resistance areas each capable of being configured into a magnetic stack and a data storage device. As shown, the magnetic stack tends to have more ferromagnetic coupling as resistance area decreases. Hence, the tuning of magnetic stack layers for the number of layers, materials, and thicknesses can dictate the presence and strength of negative exchange coupling for a variety of different magnetic stack sizes, which corresponds to diverse resistance areas.

The diverse tuning options for a magnetic stack can render a plethora of different performance capabilities that suit a variety of data storage environments, such as bit patterned media, high areal density rotating data media, and hybrid data storage systems. FIG. 10 generally maps an example magnetic stack fabrication routine 270 that can tune magnetic stack performance in accordance with various embodiments. Magnetic stack fabrication may begin by depositing a magnetically free bi-layer with a metal alloy layer and intervening layer on a substrate, such as a magnetic shield, in step 272. It should be noted that step 272 may form a free layer of a single material or a bi-layer of two different materials with a predetermined free layer thickness.

Deposition of the first free bi-layer in step 272 proceeds to step 274 where the intervening layer is plasma etched with selected etch power and duration to produce a predetermined surface roughness atop the intervening layer. Such intervening layer interface conditioning may contact a single barrier layer or a barrier lamination having a barrier core disposed between barrier sub-layers, as displayed in FIGS. 3 and 4. Decision 276 evaluates if a single barrier layer or barrier lamination is to be formed on the plasma etched first free bi-layer. If a barrier lamination is to be constructed, step 278 proceeds to form a barrier sub-layer with a predetermined thickness before a MgO barrier layer is deposited in step 280 and step 278 again forms a barrier sub-layer to position sub-layers on opposite sides of the MgO barrier layer.

In the event a barrier lamination is not to be constructed, decision 276 advances to step 280 to deposit the MgO barrier layer without forming a barrier sub-layer in step 278. Step 280 may deposit a different material than MgO and can tune the thickness of the barrier layer to one of many different thicknesses without limitation. The formation of the barrier structure, whether it is a single layer or a lamination of layers, is then followed by step 282 where a second magnetically free bi-layer comprised of an intervening layer and a metal alloy layer is deposited on the barrier structure. Much like step 272, but not limited to the materials and thicknesses of the first free bi-layer, step 282 can tune the construction of the second free bi-layer to induce negative exchange coupling across the barrier structure, which allows reliable magnetic operation in magnetic stacks with reduced physical dimensions and resistance areas.

Through the steps and decisions of routine 270, a magnetic stack can be tuned for material, thickness, and operation. However, the steps and decision of routine 270 are not required or limiting as any aspect can be modified and removed while any number of additional steps and decisions could be added. For instance, at least one additional step may form magnetic shields vertically and laterally about the magnetic stack to dictate a magnetic extent to which the first and second free bi-layers sense magnetic fields. In another example, the magnetic stack may be implemented into a transducing head portion of a data storage device, such as a hybrid solid-state, rotating media device.

With the tuning of the magnetic free layers and barrier structure of a magnetic stack for material, number of layers, and thickness, the magnetostatic interactions within the magnetic stack can be controlled to produce negative ferromagnetic coupling. The ability to tune a magnetic stack configuration to provide predetermined negative ferromagnetic coupling with minimal TMR performance penalty can correspond with high signal-to-noise ratio and near-zero magnetic asymmetry that optimizes data bit resolution, which can allow the magnetic stack to be utilized in high areal bit density data storage environments. Moreover, the production of negative ferromagnetic coupling can be tuned for a variety of resistance areas that indicates good scalability and reliable magnetic operation in a wide range of physical dimensions.

While the embodiments have been directed to magnetic sensing, it will be appreciated that the various embodiments can readily be utilized in any number of other applications, including data storage device applications. It is to be understood that even though numerous characteristics and configurations of the present disclosure have been set forth in the foregoing description, together with details of the structure and function of various embodiments, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular application without departing from the spirit and scope of the present technology.

What is claimed is:

1. An apparatus comprising a magnetic stack comprising a barrier layer disposed between first and second magnetically free layers, the barrier layer comprising a barrier core and at least one barrier sub-layer, the magnetic stack being horizontally symmetrical and configured to provide negative exchange coupling between the magnetically free layers.

2. The apparatus of claim 1, wherein the magnetic stack is a trilayer sensor without a fixed magnetization.

3. The apparatus of claim 1, wherein the magnetic stack is positioned across an air bearing surface from a rotating data medium.

4. The apparatus of claim 1, wherein the barrier core disposed between first and second barrier sub-layers.

5. The apparatus of claim 4, wherein the barrier core comprises MgO with a thickness of 0-3 nm.

6. The apparatus of claim 4, wherein the barrier sub-layers each comprise a pure Mg metal with a thickness of 0-1 nm.

7. A data storage device comprising a magnetic stack comprising a barrier layer disposed between first and second magnetically free bi-layers, at least one free bi-layer comprising an intervening layer separating a metal alloy layer from the barrier layer, the barrier layer comprising a barrier core and at least one barrier sub-layer, the magnetic stack being horizontally symmetrical and configured to provide negative exchange coupling between the magnetically free bi-layers.

8. The data storage device of claim 7, wherein each magnetically free bi-layer comprises a $CoFe_xB_y$ metal alloy layer and the intervening layer, where x and y are different atomic percentages, x is from 0-100 atomic % and y is 5-40 atomic %.

9. The data storage device of claim 8, wherein the intervening layer of the first and second magnetically free bi-layers each comprise matching materials.

10. The data storage device of claim 8, wherein the intervening layer of the first and second magnetically free bi-layers each comprise different materials.

11. The data storage device of claim 8, wherein the metal alloy layer of the first and second magnetically free bi-layers each comprise matching materials.

12. The data storage device of claim 8, wherein the metal alloy layer of the first and second magnetically free bi-layers each comprise different materials.

13. The data storage device of claim 7, wherein the intervening layer has a thickness of 0-4 nm.

14. The data storage device of claim 7, wherein a magnetically free bi-layer comprises a $CoFe_uB_v$ intervening layer with u being 0-100 atomic % and v being 0-20 atomic %.

15. The data storage device of claim 14, wherein the intervening layer comprises 0-20 atomic % of one of the following: V, Hf, W, Ta, W, Zr, Ni, Cr, Mg, Nb, Mo, and Be.

16. The data storage device of claim 7, wherein the first and second magnetically free bi-layers have matching materials and thicknesses at an air bearing surface of the magnetic stack.

17. A method comprising:
    forming a magnetic stack by disposing a barrier layer between first and second magnetically free layers, each magnetically free layer comprising a metal alloy layer separated from the barrier layer by an intervening layer, the barrier layer comprising a barrier core and at least one barrier sub-layer, the metal alloy and intervening layers being different materials, the magnetic stack being horizontally symmetrical; and
    providing negative exchange coupling between the magnetically free layers.

18. The method of claim 17, wherein a predetermined surface roughness is created at an interface between the first magnetically free layer and the barrier layer by plasma etching removing more than zero and less than one nanometer of material.

19. The method of claim 18, wherein the plasma etching has a power of 10 to 300 Watts.

20. The method of claim 18, wherein the plasma etching has a duration of more than zero and less than 360 seconds.

* * * * *